United States Patent [19]
Gordon

[11] Patent Number: 4,783,788
[45] Date of Patent: Nov. 8, 1988

[54] HIGH POWER SEMICONDUCTOR LASERS

[75] Inventor: Eugene I. Gordon, Convent Station, N.J.

[73] Assignee: Lytel Incorporated, Somerville, N.J.

[21] Appl. No.: 809,578

[22] Filed: Dec. 16, 1985

[51] Int. Cl.⁴ .............................................. H01S 3/19
[52] U.S. Cl. ........................................ 372/45; 372/46; 372/49; 372/50; 372/102
[58] Field of Search ................ 372/44, 45, 46, 49, 372/50, 96, 97, 102, 108; 357/17, 16

[56] References Cited
U.S. PATENT DOCUMENTS 4,359,776  11/1982  Acket et al. ........................... 372/46
4,573,163  2/1986  Kaminow ............................... 372/96

FOREIGN PATENT DOCUMENTS 0187079  9/1985  Japan ...................................... 372/50

OTHER PUBLICATIONS

D. Botez, "Laser Diodes are Powered-Packed," IEEE Spectrum, Jun. 1985, pp. 43–53.

Primary Examiner—William L. Sikes
Assistant Examiner—Georgia Y. Epps
Attorney, Agent, or Firm—Marmorek, Guttman & Rubenstein

[57] ABSTRACT

High power semiconductor lasers which operate in the fundamental lateral and transverse mode are disclosed. Fundamental transverse mode behavior is well known by virtue of using a thin active layer. Fundamental lateral mode behavior in a wide double hetero-structure laser is achieved by selectively enhancing losses in the higher order lateral modes. Alternatively, a distributed feedback structure such as a grating may be used to achieve fundamental lateral mode operation in a wide double hetero-structure semiconductor laser.

14 Claims, 3 Drawing Sheets

HIGH POWER SEMICONDUCTOR LASERS

FIELD OF THE INVENTION

This invention relates to semiconductor current injection diode lasers and, more particularly, to wide stripe double heterostructure lasers capable of operating at high power in the fundamental lateral mode.

BACKGROUND OF THE INVENTION

The initial application for semiconductor lasers was in fiber optic communications which required only relatively low laser output powers: 3 to 5 mW delivered in a single stable beam corresponding to lowest order mode operation. Such low power semiconductor lasers have found extensive use in long and short range communications systems, and in digital audio disc playback apparatus.

More recently, however, there has been an ever increasing demand for single mode lasers which can emit at significantly higher powers, i.e., powers in excess of 100 mW. Such devices could be used in optical recording, high speed printing, data distribution systems, analog signal transmission, long distance optical communication systems at high bit rates, industrial processing, and as pumps for solid state lasers. For all of these applications, it is desirable to have a high powe laser that stably and reliably produces a single well defined beam, i.e., lowest order mode output.

The most important type of semiconductor diode laser is the double hetero-structure (DH). It is the primary type of semiconductor diode laser being used commercially today. The DH comprises a semiconductor body having first and second relatively wide-bandgap cladding layers of opposite conductivity type, and a relatively low doped narrow bandgap active layer which is sandwiched between and contiguous with the wide bandgap cladding layers. The layers are grown on a suitable substrate. Illustratively, the narrow bandgap active layer comprises GaAs and the wide bandgap cladding layers comprise $Al_xGa_{1-x}As$ where x is about 0.25 to about 0.35. The substrate is GaAs. Generally, electrical contacts are provided on the top and bottom surfaces of the semiconductor body comprising the laser so that the resulting diode structure can be forward biased.

When the structure is forward biased, electrons and holes from the cladding layers are injected into the active layer where radiative recombination takes place. The radiation occurs within a wavelength band determined by the bandgap of the active layer. The cladding layers are transparent to the emitted radiation. Normally, the active layer is highly absorbing. In this example the emitted radiation is at 0.88 microns. The emitted radiation travels longitudinally back and forth between partially reflective end facets of the semiconductor body. As the forward bias pumping current is increased further, absorption is diminished and finally is replaced by amplification. Lasing begins when the round trip optical gain within the wavelength band for emission exceeds losses due to mechanisms such as absorption, scattering, and facet transmission. When the current begins, the circulating power increases rapidly until the net gain saturates at a value infinitesimally below the net loss. The laser then achieves a steady state circulating power level. Radiation transmitted through the end facets produces the output beam.

The index of refraction of the active layer is larger than the index of refraction of the surrounding cladding layers. Thus, the emitted radiation is transversely confined in a one-dimensional dielectric waveguide formed by the two cladding layers and the active layer. For state of the art devices with active layers thinner than about 0.3 micrometers, the dielectric waveguide is such that only the fundamental transverse mode is supported. (As used herein, transverse means perpendicular to the plane of the layers comprising the laser.)

While the light is guided in the lowest order mode in the transverse direction, such is not normally the case in the lateral direction (i.e., in the plane of the layers). If a wide stripe contact is used to inject the pumping current, the optical output exhibits unstable, multimode and filamentary behavior, such as was the case with early diode lasers. The light versus current characteristic is highly nonlinear. The unstable filamentary behavior is exagerated as one goes to higher and higher powers. Thus, such wide stripe structures, although they can produce the desired high power, have heretofore proven unsuitable for use in the typical applications contemplated for high power diode lasers, which applications require a single, stable, lowest order mode optical beam. However, they have found use where the requirement is simply infrared illumination.

Various techniques have been developed to provide for lateral confinement of emitted radiation, so as to achieve stable and reliable laser operation in the fundamental lateral mode. The simplest technique involves use of a narrow stripe contact (less than 8 um wide) on the upper surface of the laser. If the electric contact is shaped into a narrow stripe running the length of the diode between the facets, the profile of the injected carriers establishes a weak waveguide which provides a type of current dependent guiding commonly referred to as gain guiding. However, these structures exhibit strongly unstable multiple beam behavior at high powers and a non-linear light output versus current behavior known as kinking.

In the last ten years, researchers have concentrated on controlling the lateral modes in diode lasers by introducing dielectric waveguide structures in the lateral direction as well as the transverse direction. These lasers are known as index guided lasers. Using index guiding techniques and thin active layers, it is possible to produce a laser which supports only the fundamental transverse mode and the fundamental lateral mode. Such lasers, having a two-dimensional waveguide structure, emit a single, spatially coherent beam of light whose intensity profile at the facet is a bell-shaped surface. The single beam will remain stable in the laser's far field (more than 5 microns from the emitting facet) whether the current driving the diode is pulsed or continuous, and independent of the current level short of damaging the device. The output power is highly linear with current.

One type of index-guided laser is known as Buried Hetero-structure. In this structure a stripe-shaped relatively high index active region (e.g. GaAs) is surrounded transversely and laterally by lower index of refraction material (e.g. AlGaAs). Proper choice of dimensions assures lowest order mode operation. Another type of index guided laser is known as the ridge-guided structure in which a longitudinally extending ridge is etched into the upper cladding layer of a double hetero-structure laser. Light propagating in the active layer tends to be laterally confined to the region below the ridge because of the effective decrease in index of refraction associated with the boundary of the ridge. Other index guided structures are described in Botez, "Laser Diodes Are Power Packed", *IEEE Spectrum*, June 1985, pp. 43-54.

However, the output power of such index guided lasers formed using the AlGaAs-GaAs materials system is limited by damage to the partially reflecting end facets of the diode laser. If an AlGaAs diode emits continuous wave optical power densities in excess of 6 to 9 mW per square micrometer of emitting area at the facet, the internal laser power density becomes so high that chemical reactions occur at the partially reflective end facets from which the light emerges. Stress is created and the end facet regions gradually darken, absorbing light, and the laser performance degrades. The output power also exhibits rapid time variations associated with the dynamics of the absorption process.

In addition, laser light is absorbed because of the non-radiative recombination of carriers at the end facets, where the boundary of the semiconductor material has a high density of surface states. At high optical power densities (20-25 mW per square micrometer), heavy radiation absorption at the facets induces a thermal runaway process, which causes the mirrors to melt, thus causing catastrophic failure of the diode laser. The output power limits imposed by the gradual or catastrophic failure of the laser end facets have heretofore been extended by any of three known techniques.

First, the size of the lasing spot can be increased both perpendicular to and parallel to the plane of the layers, to spread the emitted power over a wider area, thus allowing operation at higher powers before the emitting facets are gradually degraded or catastrophically damaged. Transverse spreading is limited in a double heterostructure because a thin active layer is needed to achieve fundamental transverse mode behavior and there are practical limits on how thin the layer can be. Furthermore, while lateral spreading may lead to substantially increased power, it may also lead to the appearance of higher order lateral modes. Thus, merely increasing the area of the laser spot as, for example, by increasing the width of the active region in a stripe-shaped structure will not lead to the achievement of a high power laser diode which operates in the fundamental lateral mode.

The second technique for boosting the power capability of a diode laser is to apply an anti-reflection coating to the front facet and a reflection coating to the back facet of the laser to increase the ratio of the laser's emitted power to internal power, thereby getting more power out for a given amount of internal power. This technique has limited value since in a typical laser ⅔ of the internal power is transmitted through the facets, even without an AR coating. A third technique for increasing the power output of a laser is to prevent the mirror regions from absorbing laser light or experiencing non-radiative recombination. Such structures are known as non-absorbing mirror or NAM structures. These are effective in increasing the catastrophic damage limit but are less efficient than conventional lasers.

The aforementioned structures have proved to be of limited usefulness in achieving reliable fundamental transverse and fundamental lateral mode behavior at high powers.

In view of the foregoing, it is the object of the present invention to provide a reliable, high power semiconductor diode laser which operates in the fundamental lateral mode. More particularly, it is the object of the present invention to provide a high power semiconductor diode laser by increasing the lateral size of the laser spot while at the same time avoiding higher order lateral modes. In other words, it is the object of the present invention to provide a wide stripe semiconductor laser diode in which higher order lateral modes are suppressed so that stable and reliable operation in the fundamental lateral mode is achieved.

SUMMARY OF THE INVENTION

The present invention is a wide stripe double heterostructure laser which operates in the fundamental lateral and fundamental transverse mode. Fundamental transverse mode behavior is achieved by means of a conventional double hetero-structure with a thin active layer. Fundamental lateral mode behavior in the wide stripe structure is achieved by suppressing the higher order lateral modes. Mode suppression is achieved by selectively increasing the loss of the higher order lateral modes.

There are several structures which may be used to achieve fundamental lateral mode behavior in a wide stripe double hetero-structure laser. One such structure utilizes the mode dependent coupling loss which occurs when a wide laterally wave-guided active region is formed longitudinally adjacent and contiguous with a narrow laterally wave-guided active region. The wide wave-guided region is normally wide enough to support higher order lateral modes while the narrow wave-guided region can support only the fundamental lateral mode. However, the coupling between the narrow fundamental and wide multimode wave-guided regions is such that the coupling loss increases with increasing lateral mode number of the multimode guide. The lowest order lateral mode has the smallest coupling loss and thus the lowest threshold current for lasing. Consequently, stable operation in the fundamental lateral mode is achieved in the wide waveguide. In other words, the wide waveguide region provides the high output power while the narrow region provides the mode selectivity. Illustratively, the wide and narrow waveguide regions may be formed as ridge guided structures, with a wide ridge region defining the wide waveguide and a contiguous longitudinally adjacent narrow ridge defining the narrow waveguide.

Another structure for achieving fundamental lateral mode operation comprises a laterally wave-guided active region normally wide enough to support higher order lateral modes which is coupled to an even wider longitudinally adjacent optically active region without lateral wave guiding means. This second region is terminated by a facet. Light propagating from the guided region to the unguided region diffracts out into the unguided region and, after reflection off the end facet of the laser, does not couple perfectly back into the guided region. Since the higher order lateral modes diffract more, they experience greater loss. The lowest order lateral mode suffers the least loss, thus enabling the guided region to operate stably in the lowest order lateral mode.

In both of the aforementioned structures, the lowest order lateral mode has the lowest current threshold for lasing since it has the lowest loss. When the laser is turned on, the circulating power for the lowest order mode grows more rapidly than the circulating power for the higher order modes and saturates the gain, effectively blocking oscillation in the higher order modes, even though the current may exceed the threshold for oscillation in the higher order modes.

Lowest order lateral mode operation may also be achieved in a wide stripe structure when distributed feedback is used. In this case facet reflection is eliminated and the distributed feedback can operate only for the lowest order lateral mode.

BRIEF DESCRIPTION OF THE DRAWINGS

For purposes of clarity, the drawings have not been drawn to scale.

DETAILED DESCRIPTION OF THE INVENTION

Figure 1:
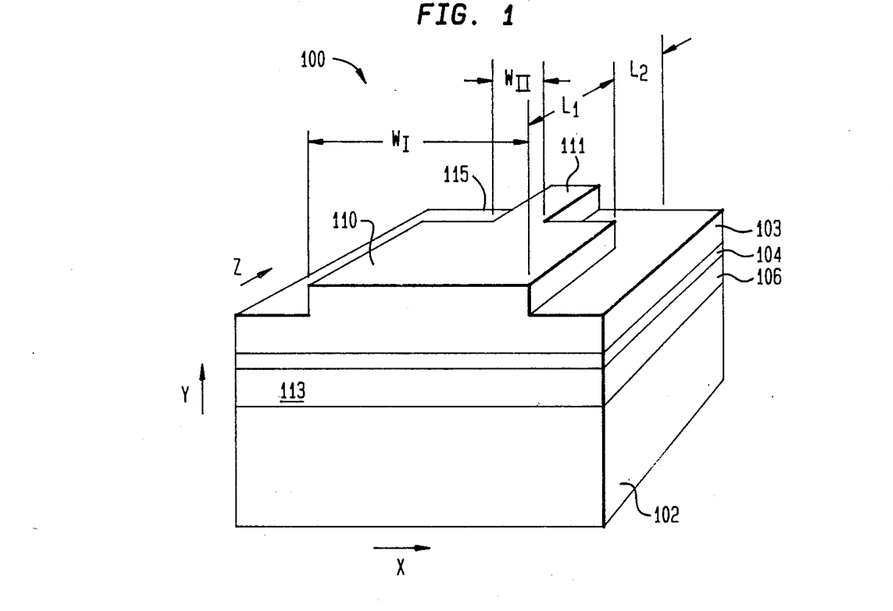
FIG. 1 shows a wide stripe ridge guided double hetero-structure laser which operates in the lowest order lateral mode in accordance with an illustrative embodiment of the invention.

Turning to FIG. 1, a double hetero-structure laser 100 which operates in the fundamental lateral mode is illustrated. Illustratively, the laser 100 is formed using the GaAs-AlGaAs material systems although other material systems such as the InGaAsP-InP material system may be used.

The laser 100 comprises an n-type GaAs substrate 102. The substrate 102 has a thickness of about 150 microns and a dopant concentration of about $3 \times 10^{18}/cm^3$. A relatively narrow band gap GaAs active layer 104 is located between and contiguous with relatively wide band gap cladding layers 106 and 103. The cladding layers 106 and 103 are formed from $Al_xGa_{1-x}As$ where x is on the order of 0.25 to 0.35. The layer 106 is an n-type layer having a total thickness of about one micron and a dopant concentration of about $3 \times 10^{18}/cm^3$. The layer 108 is a p-type layer which also has dopant concentration of about $3 \times 10^{18}/cm^3$. The active layer 104 is thinner than the cladding layers, about 0.1 microns thick or less and is not intentionally doped.

A relatively wide ridge-shaped region 110 and a relatively narrow ridge-shaped region 111 are formed integrally with the cladding layer 108 by chemical etching. As discussed below, the ridge-shaped regions 110, 111 are used to insure that the laser 100 oscillates in the fundamental (i.e. lowest order) lateral mode despite the wide ridge waveguide which is normally wide enough to support higher order lateral modes. The portions of the cladding layer 103 not forming the ridge-shaped regions have a thickness of about 0.4 microns while the ridge-shaped regions 110, 111 add an additional thickness of about 0.6 microns. A p-type capping layer and a metallic contact layer (not shown) are formed on top of the ridge-shaped regions 110, 111 so that the structure shown in FIG. 1 may be forward biased. Illustratively the capping layer is about 0.2 to 0.5 microns thick and has a dopant concentration of about 1 to $2 \times 10^{19}$ cm$^{-3}$. The metal contact is illustratively formed from titanium, platinum and gold.

The laser 100 of FIG. 1 may be manufactured as follows: A relatively thick n-type $Al_xGa_{1-x}As$ layer, a relatively thin intrinsic GaAs layer, a relatively thick p-type $Al_xGa_{1-x}As$ layer, and a thin GaAs capping layer are successively grown on the GaAs substrate 102 by use of conventional techniques such as liquid phase epitaxy or vapor phase epitaxy. The two last deposited layers are then etched in such a manner as to define the wide and narrow ridge-shaped structures 110, 111. Electrodes are used to supply pumping current. Upper electrodes such as metallic contacts deposited on the respective ridge structures 110, 111 by conventional techniques. Illustratively, the metal may be put down before etching. The metal is then used as the etching mask to form the ridges.

When a forward bias voltage is applied to the p-i-n structure formed by the cladding layers 106 and 103 and the active layer 104, electrons and holes are injected into the active layer 104 where radiative recombination takes place. Some radiation emitted in the active region 104 propagates longitudinally (i.e. in the z direction) between the cleaved end facets 113 and 115 which serve to define a Fabry-Perot resonator for the laser 100. When the gain in the active layer exceeds losses, laser oscillations are set up. Transverse confinement (i.e. confinement in the y direction) of the radiation emitted in the active layer 104 is provided by the cladding layers 106 and 103 which have a lower index of refraction than the active region 104. Thus, fundamental transverse mode operation is achieved.

Lateral confinement of the radiation emitted in the active layer 104 is provided by the ridge-shaped regions 110, 111 which are integrally formed with the cladding layer 108. The portion of the cladding layer 103 which forms the ridges 110, 111 is thicker than the cladding layer on either side of the ridges. The index of refraction of the cladding layer is about 3.5, which is significantly greater than that of air whose index of refraction is unity. Thus, the effective index of refraction under the ridge is greater than that on either side. The evanescent field above the DH extends to the surface and is influenced by the geometrical variation in thickness. This provides the necessary geometry for index guiding. The relatively wide ridge region 110 serves to define a relatively wide, normally multimode, waveguide for laterally confining (i.e. confining in x direction) radiation propagating thereunder in the active layer. The relatively narrow ridge region 111 serves to define a fundamental mode waveguide for laterally confining radiation propagating thereunder in the active layer.

Thus, the laser 100 of FIG. 1 comprises a relatively wide waveguide and a narrow fundamental mode waveguide located longitudinally adjacent thereto. The wide waveguide has a width which would normally support higher order lateral mode oscillations. However, because the wide waveguide is optically coupled to the narrow fundamental mode waveguide, with maximum coupling to the lowest order mode, only fundamental lateral mode oscillations are supported in the wide waveguide. It is important to note that the coupling is part of the feedback path and the greater the coupling the greater the feedback.

Illustratively, the wide waveguide has a width $W_1$ of about 20 microns or more, and the narrow waveguide has a width of about 2 microns. The wide waveguide has a length $L_1$ of about 250 microns and the narrow waveguide has a length $L_2$ of about 100 microns.

Note, that instead of using ridge-shaped structures to define narrow and wide waveguides, the narrow and wide waveguide structures may be formed using inverted rib waveguides, V-groove waveguides, or through the use of a double channel lateral guiding structures. Numerous structures for forming waveguides for laterally confining radiation are discussed in the aforementioned article by Botez.

The suppression of higher order lateral modes as a result of coupling wide and narrow waveguide regions may be understood as follows.

The power reflectivity at the interface between the wide and narrow waveguide is $$R_m = C_{mo}^2 G^2 R \qquad (1),$$

where $R_m$ is the effective reflectivity at the non-faceted end of the wide waveguide, R is the facet reflectivity at the facet 115, $C_{mo}$ is the coupling coefficient for the $m^{th}$ order lateral mode of the wide waveguide to the fundamental mode of the narrow waveguide and G is the net gain of the portion of the active layer inside the narrow waveguide. Note that this gain may be larger than or smaller than 1. The gain in the wide portion of the active region must be larger than 1 to get any kind of lasing operation at all. $C_{mo}$ is given by the following equation:

$$C_{mo} \approx (W_{II}/W_I)(1 - m^2 W_{II}^2/W_I^2) \qquad (2).$$

Equations (1) and (2) indicate that the effective reflectivity goes down sharply as the mode number goes up and that the coupling loss is least for the m=0 order mode. Accordingly, the wide waveguide portion of the laser 100 of FIG. 1 operates stably in the fundamental lateral mode.

Note that only a symmetrical mode of the wide waveguide can couple to the symmetrical fundamental mode of the narrow guide since the narrow waveguide is centered on the wide waveguide, i.e., both waveguides share the same longitudinal axis. Accordingly, centering the narrow waveguide on the wide waveguide is desirable for providing mode selectivity.

Thus, a wide stripe double heterostructure laser has been disclosed which operates in the lowest order lateral mode. Problems relating to gradual degradation or catastrophic failure of the facets 113, 115, or to heating resulting from high current density, have been alleviated because the area of the lasing spot has been increased while at the same time higher order lateral modes have been suppressed.

In some circumstances, it may be desirable to put an anti-reflection coating portion (not shown) at the center of the facet 113, which facet terminates the wide waveguide portion of the laser 100. The anti-reflection coating will introduce a small peak in the near field distribution. Alternately, loss can be introduced near the facet to introduce a small dip in the near field pattern. The loss can be achieved simply by blocking the injection of current. Either approach will suppress a potential filamentary mode involving the narrow waveguide and the center of the wide waveguide. Off-center filamentary modes are completely suppressed since there is essentially no feedback from the internal end of the wide waveguide. Despite the small variation in the near field pattern, the far field pattern has a prominent central lobe so that a stable single lobe Gaussian beam results.

Figure 2:
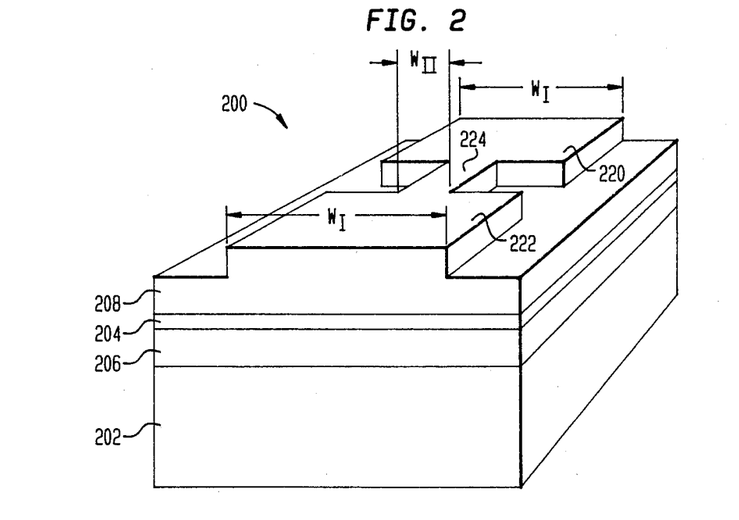
FIGS. 2, 3(a) and 3(b) show alternate embodiments of wide stripe ridge guided double hetero-structure lasers which operate in the lowest order lateral mode in accordance with alternate embodiments of the invention.

Turning to FIG. (2), an alternative geometry for a high power ridge-guided double hetero-structure laser which operates in the lowest order lateral mode is illustrated. The laser 200 of FIG. (2) comprises substrate 202, active layer 204, and cladding layers 206 and 208. The laser of FIG. (2) is substantially identical to the laser 100 of FIG. (1) except that the cladding layer 208 has two relatively wide ridge-shaped structures 220, 222, separated by a narrow ridge-shaped structure 224. The three ridge structures 220, 222, 224 share the same longitudinal axis. The two relatively wide ridge-shaped structures 220, 222 define two relatively wide waveguides for laterally confining radiation emitted in the active region, which wide waveguides are separated by a narrow waveguide defined by the narrow ridge-shaped structure 224.

Illustratively, the width $W_I$ of the wide waveguides is on the order of 10 microns while the width $W_{II}$ of the narrow waveguide is on the order of one micron. Normally, the width $W_I$ is large enough to support oscillations in the higher order lateral modes. However, when the wide waveguides are coupled to the narrow waveguide, a wide waveguide structure which oscillates only in the lowest order lateral mode is achieved. More particularly, the two pass loss $L_m$ for the narrow waveguide region 224 is given by the formula $$L_m = C_{mo}^4 G^2 \qquad (3)$$

wherein $C_{mo}$ and G have been defined above.

Equation (3) indicates that coupling of radiation from the wide waveguides into and through the narrow waveguide is such that the power loss suffered by each lateral mode goes up with the lateral mode number, with the lowest order lateral mode suffering the lowest power loss. Accordingly, stable fundamental lateral mode operation for the wide waveguide structure illustrated in FIG. 2 is achieved. Because the two pass loss is proportional to $C_{mo}^4$ rather than $C_{mo}^2$, the laser structure of FIG. 2 may in certain circumstances be more effective than the laser structure of FIG. 1 in the suppression of higher order lateral modes.

Figure 3A:
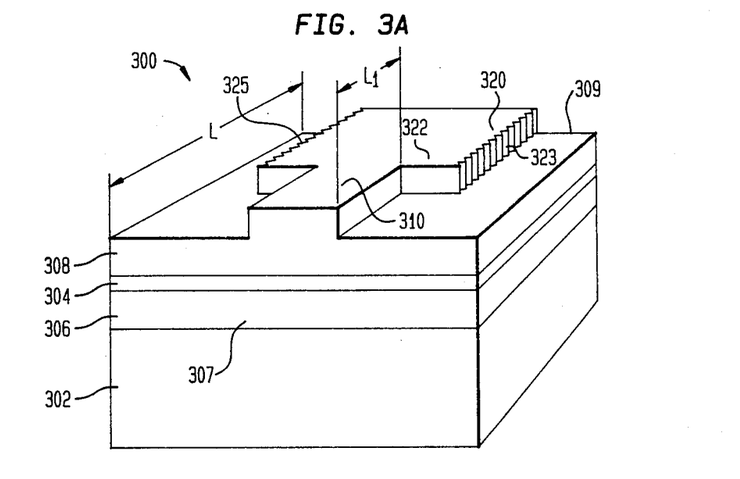
Figure 3B:
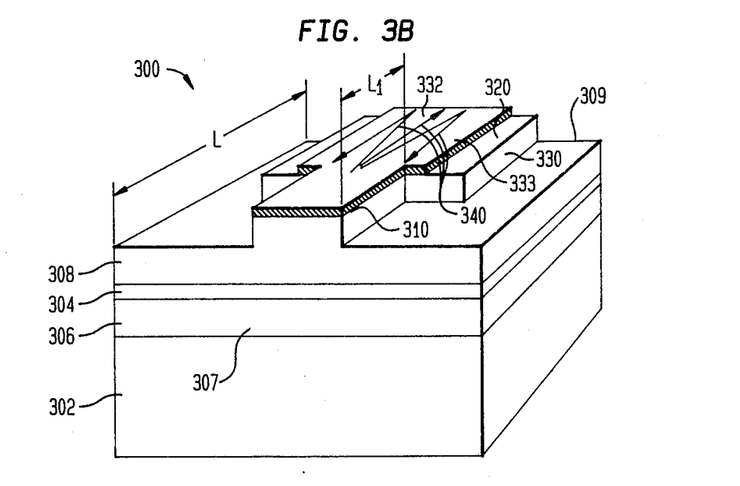

The lasers of FIGS. 3(a) and 3(b) each comprise a substrate 302, an active layer 304 and cladding layers 306 and 308. The cladding layers 306, 308 and the active layer 304 are bound by partially reflecting end facets 307, 309. Each of the lasers of FIGS. 3(a) and 3(b) includes a relatively wide lateral waveguide defined by the ridge 310 which is formed in the cladding layer 308. The ridge 310 serves to define a waveguide which is bound by the facet 307 and which is normally wide enough to support higher order lateral modes. Illustratively, the ridge 310 has a length $L_I$ on the order of 200 microns, which is less than the total length L of the laser, which is about 400 microns. The width of the ridge 310 is about 10 microns. In the lasers of FIGS. 3(a) and 3(b), the waveguide defined by the ridge 310 is coupled to a laterally unguided region 320. In FIG. 3(a), the laterally unguided region is defined by ridge 322, which is wider than the ridge 310. The ridge 322 provides no lateral guiding for radiation propagating in or near the active layer, because it has jagged lossy sidewalls 323, 325. The ridge 322 is bound at one end by the facet 309 and has a width of about 15 microns, i.e., somewhat greater than the width of ridge 310.

In FIG. 3(b) the laterally unguided region is defined by the ridge 330, which is bound by the facet 309, and which has a width of about 20 microns. Pumping current is applied to the laser of FIG. 3(b) by means of the contact 332. The contact is attached by means of a capping layer 333. The portion of the contact 332 on top of the ridge 310 is coextensive therewith. The portion of the contact 332 of the top of ridge 330 is slightly wider than the ridge 310 (e.g. about 12 microns wide) but narrower than the ridge 330. There is no lateral guiding of radiation propagating underneath the ridge 330 because the section of the active layer underneath the ridge 330 comprises a centrally pumped, and hence amplifying, portion which is bordered on either side by unpumped and, hence, lossy portions. The optical coupling between the waveguide region defined by ridge 310, and the laterally unguided region in the lasers of FIGS. 3(a) and 3(b) is such that the lowest order lateral mode is strongly favored in the laterally guided region.

Optical radiation propagating in the laterally guided region defined by the ridge 310 follows paths 340 out of the waveguide defined by ridge 310 into the laterally unguided region 320 and reflects off the facet 309. Some of the laterally unguided radiation then propagates out of the unguided region 320 without coupling back into the guided region. This constitutes a loss which increases the threshold current.

Higher order lateral modes supportable by the laterally guided region diffract more in the unguided region 320 than the fundamental lateral mode. The fundamental lateral mode has a single central lobe which is directed along the common longitudinal axis of the guided and unguided regions. In contrast, higher order lateral modes have lobes which are off axis. Thus, the higher order lateral modes experience more loss than the fundamental lateral mode, so that the radiation field in the guided region comprises substantially only the fundamental lateral mode.

Advantageously, the optimum length of the unguided region of the lasers of FIGS. 3(a) and 3(b) is on the order of half the Rayleigh range, which is equal to $W_o^2/\lambda$ where $W_o$ is the waist diameter of the Gaussian beam emitted by the laser and $\lambda$ is the wavelength in the medium. The waist diameter approximates the width of the ridge 310.

A laser may also be designed to incorporate both of the aforementioned techniques for suppressing higher order lateral modes in a wide double hetero-structure laser. In this case the laser should be longitudinally divided into three regions: a narrow lowest order mode laterally wave-guided region at one end, a central laterally wave-guided region normally wide enough to support higher order lateral modes and an even wider laterally unguided region at the opposite end. Higher-order lateral modes are suppressed by both the diffraction loss mechanism discussed in connection with FIGS. 3(a) and 3(b) and the mode coupling loss mechanism discussed in connection with FIGS. 1 and 2. There is no significant disadvantage associated with taking the output from the unguided region as implied by this configuration. Although it is guided transversally and unguided laterally, implying an astigmatic output beam, the amount of the astigmatism is small and can be easily corrected.

Figure 4:
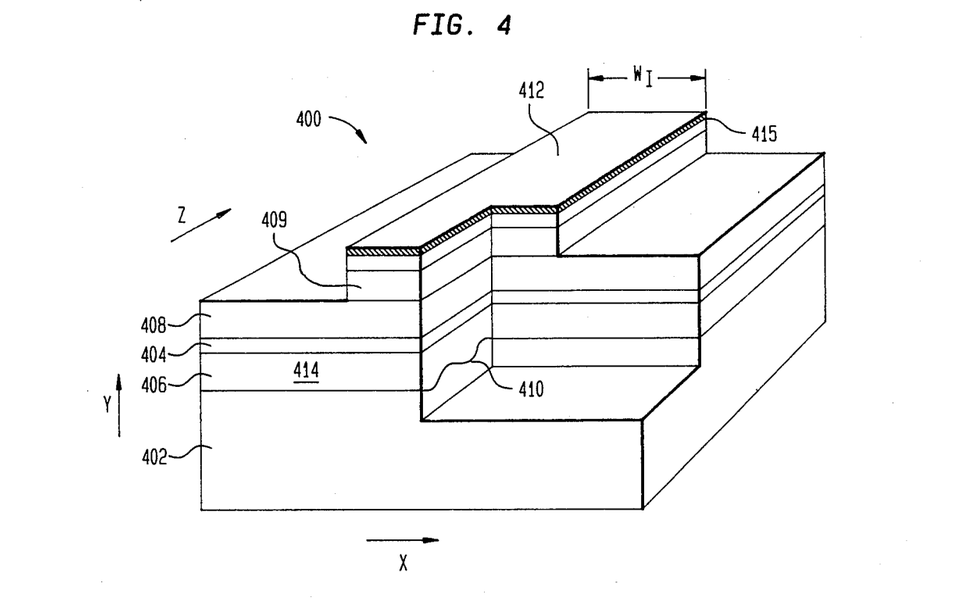
FIG. 4 shows a high power output wide stripe distributed feedback laser capable of operating in the lowest order lateral mode, in accordance with an illustrative embodiment of the invention.

Turning to FIG. 4, a wide stripe distributed feedback laser 400 is illustrated.

Illustratively, the laser 400 is formed from the GaAs-AlGaAs materials system, although other materials system such as the InGaAsP-InP materials system may be used. Illustratively, the laser 400 comprises an n-type GaAS substrate 402 upon which is formed a periodic surface corrugation or grating 410. The substrate has a thickness of about 150 microns and a dopant concentration of about $3 \times 10^{18}$ cm$^{-3}$. The period of the grating is several thousand angstroms. The grating lines are perpendicular to the longitudinal axis of the laser.

A GaAS active layer 404 is located between and contiguous with relatively wider bandgap cladding layers 406 and 408 which are formed from $Al_xGa_{1-x}As$ where x is on the order of about 0.25 to 0.35. The layer 406 is a n-type layer having a thickness of about 1 micron and a dopant concentration of about $3 \times 10^{18}$ cm$^{-3}$. The layer 408 is a p-type layer which also has dopant concentration of $3 \times 10^{18}$ cm$^{-3}$. The active layer is thinner than the cladding layers, i.e., about 0.2 microns thick, and is not intentially doped. A ridge 409 is formed integrally with the cladding layer 408. A GaAs capping layer 415 and an electrical contact 412 are formed on top of the ridge 409. Anti-reflection coatings are put on the front facet 414 of the laser 400 as well as on the rear facet not shown in FIG. 4.

When a forward bias voltage is applied to the p-i-n structure formed by the cladding layers 406 and 408 and the active layer 404, electrons and holes are injected into the active layer where recombination and the stimulated emission of radiation takes place. Feedback for the laser 400 is provided by the distributed periodic reflecting structure 410 which is formed on the upper surface of the substrate 402.

The undulations of the grating define a boundary between the GaAs substrate and $Al_xGa_{1-x}As$ cladding layer 406 which has a lower index of refraction. This produces a small periodic variation in the index of refraction for light traveling in the active layer. Each variation produces a small backward scattering of light. These reflections add in phase when the wavelength of the light in the waveguide is twice the grating period $\Lambda$. The cumulative effect can produce significant reflection.

Because of the optical feedback provided by the periodic reflecting structure 410, coherent radiation emerges from the facet 414. Of course, the emission of coherent radiation requires a sufficiently large pumping current to produce adequate population inversion in the active layer 404. Note, however, that the anti-reflection coated facet 414 does not form part of a Fabry-Perot resonator, as feedback is provided substantially by the periodic structure 410.

Transverse confinement (i.e. confinement in the y direction) of the radiation emitted in the active region 404 is provided by the cladding layers 406 and 408 which have a lower index of refraction than the active region 404. Lateral confinement of the radiation emitted in the active region 404 (i.e. confinement in the x direction) is provided by the ridge 409 which defines a wave guide of width $W_I$. Illustratively $W_I$ is 10 microns or larger. This dimension is normally ample to define a multimode lateral waveguide.

The laser 400 of FIG. 4 may be manufactured as follows. The substrate 402 is first etched to form the periodic pattern of ridges and grooves which comprise the distributed feedback structure 410. A relatively thick n-type $Al_xGa_{1-x}As$ layer, a relatively thin undoped GaAs layer, a relatively thick p-type $Al_xGa_{1-x}As$ layer and a thin GaAs capping layer 415 are successively deposited on the etched substrate by use of a conventional technique such as liquid phase epitaxy or vapor phase epitaxy. The last two deposited layers are then etched to form the ridge 409. A metallic contact 412 is then deposited on the ridge using a conventional process.

Normally, when the width $W_I$ of the waveguide defined by the ridge 409 is about 5 microns or larger, the double hetero-structure laser 400 of FIG. 4 will oscillate in higher order lateral modes. However, use of the distributed feedback structure as discussed below forces the wide geometry double hetero-structure laser 400 to operate only in the fundamental lateral mode.

The radiation field in the laser 400 of FIG. 4 is characterized by a wave vector $$k = k_x x + k_y y + k_z z \quad (4)$$

where x, y and z are unit vectors along the coordinate axes as indicated in FIG. 4 and $k_x$, $K_y$, and $k_z$ are the propagation constants associated with the geometry.

The magnitude of the wave vector k is given by the formula $$k = (k^2_x + k^2_y + k^2_z)^{\frac{1}{2}} = 2\pi/\lambda \quad (5)$$

where $\lambda$ is the wavelength of the emitted radiation.

The periodic reflecting structure 410 serves to precisely restrict $k_z$ so that:

$$k_z = \pi/\Lambda \quad (6)$$

where $\Lambda$ is the spatial period of the reflecting structure 410. No other value of $k_z$ is consistent with reflection of the forward and backward traveling waves, which provides the necessary feedback. Thus, if the laser oscillates, the value of $k_z$ that must be operative is given by Eq(6). The y component of the wave vector, $k_y$, is precisely determined by the geometry of the double heterostructure formed by the cladding layers 406, 408 and the active layer 404, i.e., $k_y$ is determined by the thickness of the active region 404 and the difference in indices of refraction between the cladding layers 406, 408 and the active layer 404. Except for very short Wavelengths, much shorter than any wavelength of interest, the active layer is a fundamental mode transverse waveguide and $k_y$ is a geometrical constant for any given structure.

The x component of the wave vector has a multiplicity of possible values defined by $$k_{xm} \approx (m+1)\pi/W_I \quad (7),$$

where m is the order of the lateral mode. The lowest order or fundamental mode has m=0.

From Eq.(5) it follows that the possible values of k that are consistent with a mode with feedback are given by $$k_m = (k_{xm}^2 + k_y^2 + k_z^2)^{\frac{1}{2}} = [(m+1)^2\pi^2/W_I^2 + k_y^2 + (\pi/\Lambda)^2]^{\frac{1}{2}} \quad (8).$$

Figure 5:
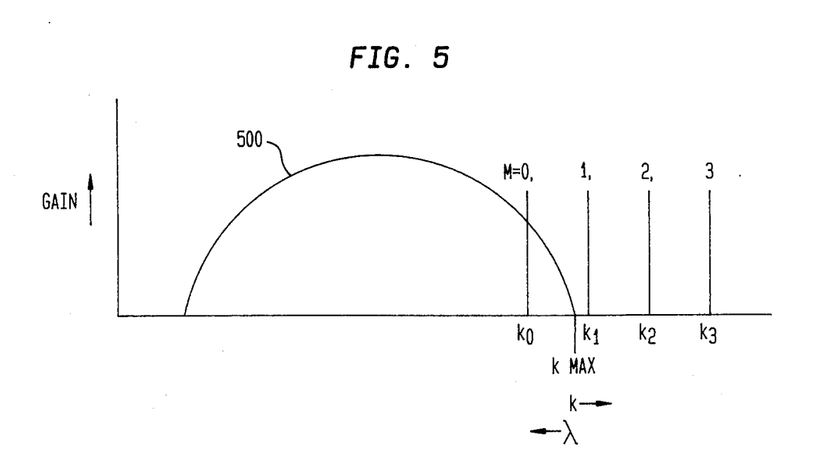
FIG. 5 shows a gain profile and mode spectrum for the laser of FIG. 4.

The values of k for m=0, 1, 2, 3 . . . are plotted in FIG. 5 In addition to feedback, it is necessary to have sufficient gain to overcome losses to achieve oscillation. FIG. 5 also shows the gain profile 500 of the laser 400 of FIG. 4 as a function of k. In FIG. 5 the maximum value of k for which there is net positive gain is denoted by $k_{max}$ and it falls between $k_o$ (corresponding to m=0) and $k_1$ (corresponding to m=1). Thus, as shown, only one mode is capable of oscillation and it corresponds to the fundamental lateral mode. If $k_{max}$ is increased to a value above $k_1$ but below $k_2$, then both the m=0 and m=1 lateral modes can oscillate. However, it is clear that the m=0 mode is strongly favored since the gain is largest for that mode. Mode competition would tend to suppress the m=1 mode. Thus, again the fundamental lateral mode is favored. If $k_{max}$ is greatly increased, then no mode is strongly favored and the technique will not be effective. However, so long as $k_{max}$ is controlled to a value slightly above $k_o$ but not necessarily below $k_1$, then fundamental lateral mode behavior is strongly favored. The composition of the active layer, the pumping current, and the temperature of the active layer are chosen to achieve a value of $k_{max}$ that results in fundamental lateral mode behavior. In addition to fundamental lateral and transverse mode behavior, the laser tends to be single frequency.

Finally, the above described embodiments of the invention are intended to be illustrative only. Numerous alternative embodiments may be devised by those skilled in the art without departing from the spirit and scope of the of the present invention. Such structures include V-groove waveguide structures, inverted rib waveguide structures, buried heterostructures of various types and gain guided structures.

I claim:

1. A semiconductor diode laser comprising
a semiconductor body includiing a substrate and an active layer capable of emitting radiation when a pumping current is applied thereto,
electrode means for applying said pumping current to said active layer,
first waveguide means for guiding radiation emitted in said active layer, said first waveguide means being wide enough to support a fundamental lateral mode and a higher order lateral mode, and
second waveguide means formed longitudinally adjacent to said first waveguide means for guiding radiation emitted in said active layer, said second waveguide means supporting only a fundamental lateral mode,
said first and second waveguides means being optically coupled, such that coupling losses are least for the fundamental lateral mode of said first waveguide means, thereby causing said first waveguide means to support only the fundamental lateral mode.

2. The laser of claim 1 wherein the width of said first waveguide means does not exceed about 10 (ten) times the width of said second waveguide means.

3. A semiconductor diode laser comprising
a semiconductor body including a substrate and first and second cladding layers,
an active layer fabricated between said cladding layers and capable of the stimulated emission of radiation when a pumping current is applied thereto,
electrode means for receiving said pumping current,
means defining a first waveguide for laterally confining said radiation, said first waveguide being wide enough to support a fundamental lateral mode and a higher order lateral mode,
means defining a second waveguide contiguous with and sharing the same longitudinal axis as said first waveguide for laterally confining said radiation, said second waveguide supporting only a fundamental lateral mode,
said first and second waveguides being optically coupled such that coupling losses are least for the fundamental lateral mode of said first waveguide so that said first waveguide supports only oscillations in the fundamental lateral mode.

4. The laser of claim 3 wherein said first and second waveguides are defined by wide and narrow ridges, respectively, formed in one of said cladding layers.

5. The semiconductor diode laser of claim 3 wherein said laser comprises means for defining a third waveguide capable of supporting a fundamental and a higher order lateral mode said first and third waveguides being separated by said second waveguide and having the same longitudinal axis as said second waveguide, said waveguides being optically coupled, so that coupling losses are least for the fundamental lateral mode of said first and third waveguides, whereby said first and third waveguides support only the fundamental lateral mode.

6. A semiconductor diode laser comprising
a semiconductor body including a substrate and an active layer capable of stimulated emission of light when a pumping current is supplied thereto,
electrode means for receiving said pumping current,
first and second parallel, spaced apart partially reflecting crystal and facets, said active layer extending between said end facets,
means extending from said first end facet for defining a first waveguide for laterally confining radiation emitted in the active layer, said first waveguide being wide enough to support a fundamental lateral mode and a higher order lateral mode,
means extending from the second end facet for defining a second waveguide, said second waveguide having a width sufficient to support only a fundamental lateral mode, said second waveguide being formed contiguous with said first waveguide and being centered on the axis of said first waveguide such that the coupling loss between said waveguides is least for the fundamental lateral mode of said first waveguide, thereby causing said first waveguide to support only the fundamental lateral mode.

7. The diode laser of claim 6 further comprising a lossy region formed on said axis near said first end facet for inhibiting filamenting of the optical field of said first waveguide.

8. The diode laser of claim 6 further comprising an anti-reflection coating region formed on said first facet at the intersection of said axis therewith, for inhibiting filamenting of the optical field of said first waveguide.

9. A semiconductor diode laser comprising:
a semiconductor body including a substrate and a laterally guided active region capable of the stimulated emission of radiation when a pumping current is supplied thereto, said laterally guided region being wide enough to support a fundamental lateral mode and a higher order lateral mode,
electrode means connected to said semiconductor body for supplying said pumping current, and
a laterally unguided active region forming part of said semiconductor body and located longitudinally adjacent to and contiguous with said laterally guided active region, said laterally unguided active region being wider than said laterally guided active region.
said laterally guided and unguided active regions being optically coupled such that losses are least for the fundamental lateral mode of said laterally guided active region, so that said laterally guided active region supports only the fundamental lateral mode.

10. A semiconductor diode laser comprising:
a semiconductor body including a substrate and a pair of spaced apart cladding layers of opposite conductivity type;
an active layer fabricated between said cladding layers and capable of the stimulated emission of radiation when a pumping current is applied thereto,
electrode means for supplying said pumping current to said active layer, and
first and second parallel, spaced apart, partially reflecting end facets,
said active layer comprising:
a first laterally guided region bound by said first end facet and wide enough to support a fundamental lateral mode and a higher order lateral mode; and
a laterally unguided region formed contiguously with and having the same longitudinal axis as said guided region and bound by said second end facet,
said radiation propagating from said laterally guided region to aid laterally unguided region diffracts out into said laterally unguided region, and after reflection off said second end facet does not completely reenter said laterally guided region thereby introducing reflection loss, such losses being least for the fundamental lateral mode of said laterally guided region, whereby said laterally guided region supports only the fundamental lateral mode.

11. The laser of claim 10 wherein said laterally guided region is defined by a first ridge formed in one of said cladding layers and wherein said laterally unguided region is defined by a second ridge formed in said one cladding layer, said second ridge being wider than said first ridge and having jagged sidewalls to inhibit the lateral guiding of the radiation thereby.

12. The laser of claim 10 wherein said laterally guided region is defined by means of a ridge formed in one of said cladding layers, and wherein said laterally unguided region is defined by applying the pumping current to a region of said active layer wider than said laterally guided region, said region of said active layer to which said pumping current is applied being laterally bordered on either side by unpumped portions of said active layer.

13. A semiconductor diode laser comprising:
a semiconductor body including a substrate, first and second spaced apart cladding layers, and an active region formed between said first and second cladding layers and capable of stimulated emission of radiation when a pumping current is applied thereto, and electrode means connected to said semiconductor body for applying said pumping current, said radiation being characterized by a wave vector having transverse, longitudinal and lateral components, said active region being wide enough to support a fundamental lateral mode and a higher order lateral mode,
means for transversely confining said radiation and thereby establishing a fixed value for said transverse component of said wave vector characterizing said radiation, and
a distributed periodic reflecting structure for providing optical feedback for said radiation, and for establishing a fixed value for the longitudinal component of said wave vector characterizing said radiation,
said values for said transverse and longitudinal components of said wave vector being established such that there is net gain in said active region only when the lateral component of the wave vector characterizing the radiation is near zero, to restrict radiation emitted in said active region substantially to a fundamental lateral mode.

14. A semiconductor diode laser comprising:

a semiconductor body including a substrate and an active region capable of the stimulated emission of radiation when a pumping current is applied thereto and wide enough to support a fundamental lateral mode and a higher order lateral mode, and electrodes connected to said semiconductor body, said radiation being characterized by a wave vector having transverse, lateral, and longitudinal components, first and second cladding layers located on the top and on the bottom of said active region, respectively, for transversely confining radiation propagating therein and for establishing a fixed value for the transverse component of said vector characterizing said radiation, and a distributed periodic reflecting structure for providing optical feedback for said radiation and for establishing a fixed value for the longitudinal component of said wave vector characterizing said radiation, said values for said transverse and longitudinal components being established such that there is net gain only when the lateral componenet of the wave vector characterizing the radiation is near zero, so as to restrict said radiation substantially to a fundamental lateral mode.

* * * * *